United States Patent [19]
Borth et al.

[11] Patent Number: 5,142,551
[45] Date of Patent: Aug. 25, 1992

[54] SIGNAL WEIGHTING SYSTEM FOR DIGITAL RECEIVER

[75] Inventors: David E. Borth, Palatine; Phillip D. Rasky, Buffalo Grove, both of Ill.; Fuyun Ling, Jamaica Plain; M. Vedat Eyuboglu, Boston, both of Mass.

[73] Assignee: Motorola, Inc., Schaumburg, Ill.

[21] Appl. No.: 662,049

[22] Filed: Feb. 28, 1991

[51] Int. Cl.⁵ .................. H04B 1/12; H03M 13/12; H04L 27/01
[52] U.S. Cl. ........................... 375/7; 375/12; 375/94; 375/96; 375/102; 375/103; 371/43; 455/76; 455/305
[58] Field of Search .............. 375/12, 14, 7, 94, 96, 375/101, 102, 103; 364/724.11; 371/43; 455/303, 305, 73, 75, 76

[56] References Cited

U.S. PATENT DOCUMENTS

| | | | |
|---|---|---|---|
| 4,484,338 | 11/1984 | Clark et al. | 371/43 |
| 4,885,757 | 12/1989 | Provence | 375/96 |
| 4,995,104 | 2/1991 | Gitlin | 375/102 |
| 5,029,186 | 7/1991 | Maseng et al. | 375/101 |
| 5,063,573 | 11/1991 | Langewellpott | 375/96 |

OTHER PUBLICATIONS

Gottfried Ungerboeck, "Adaptive Maximum-Likelihood Receiver for Carrier-Modulated Data-Transmission System", IEEE Transactions on Communications, vol. COM-22, No. 5, May 1974, pp. 624-636.

Primary Examiner—Benedict V. Safourek
Assistant Examiner—Young Tse
Attorney, Agent, or Firm—Robert H. Kelly

[57] ABSTRACT

A signal weighting system for associating a confidence level with portions of a communication signal transmitted upon a multipath channel and received by a receiver. A signal received by the receiver is equalized by an equalizer circuit, such as a maximum likelihood sequence estimator, and the equalized signal generated thereby is supplied to an adaptive filter which is synthesizes portions of the multipath channel. The signal received by the receiver is altered responsive to values of a filtered, equalized signal generated by the adaptive filter.

20 Claims, 5 Drawing Sheets

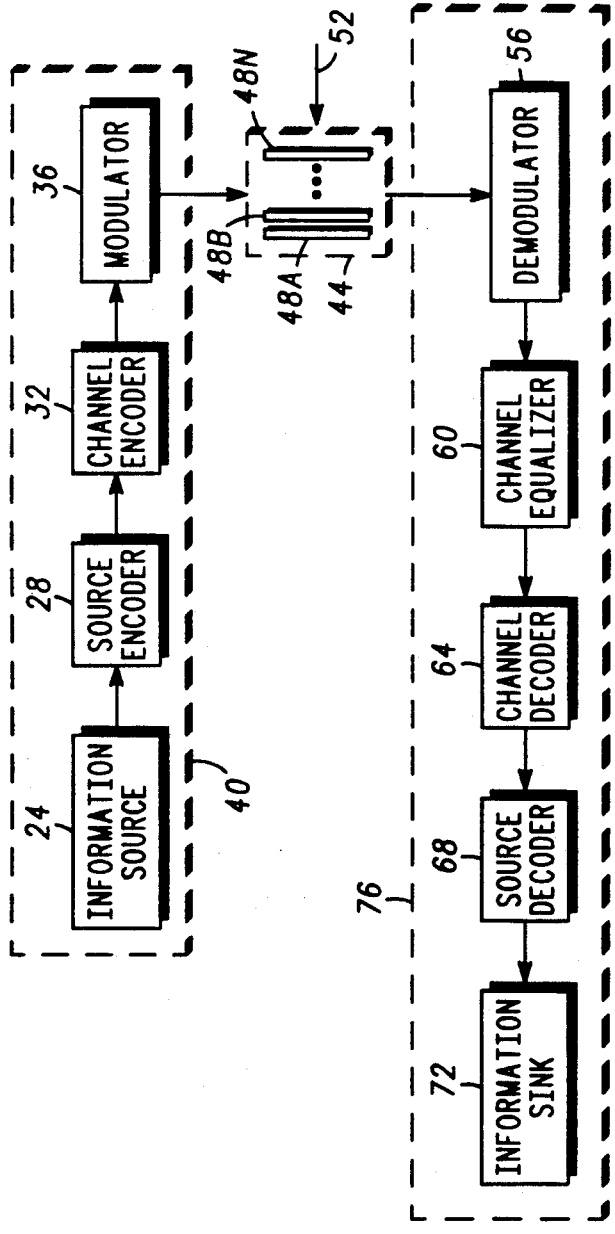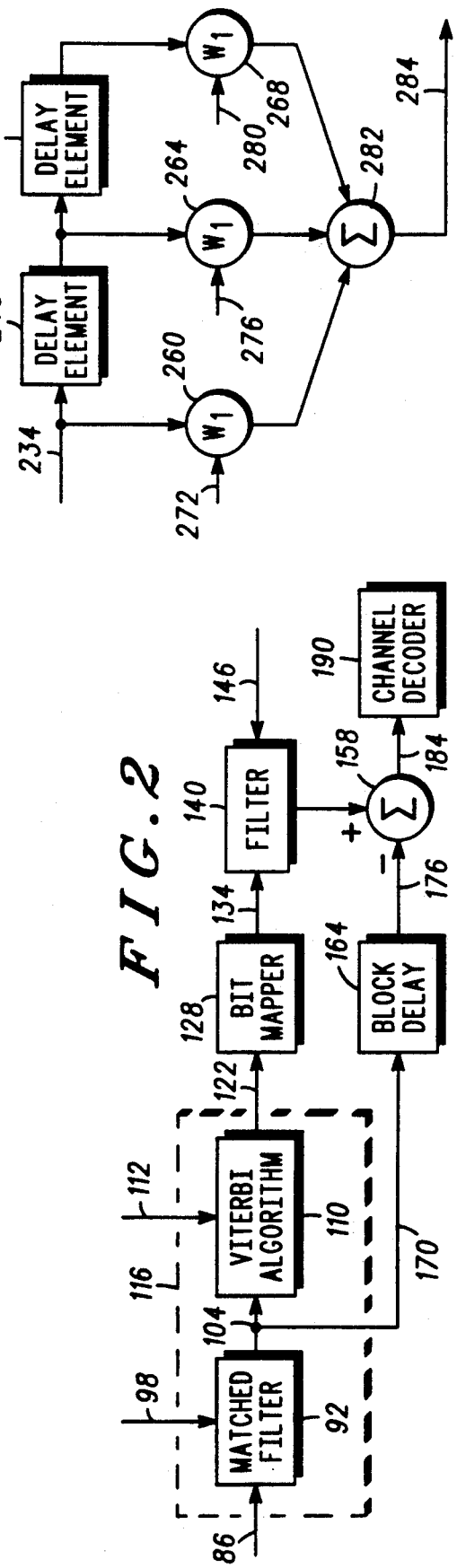

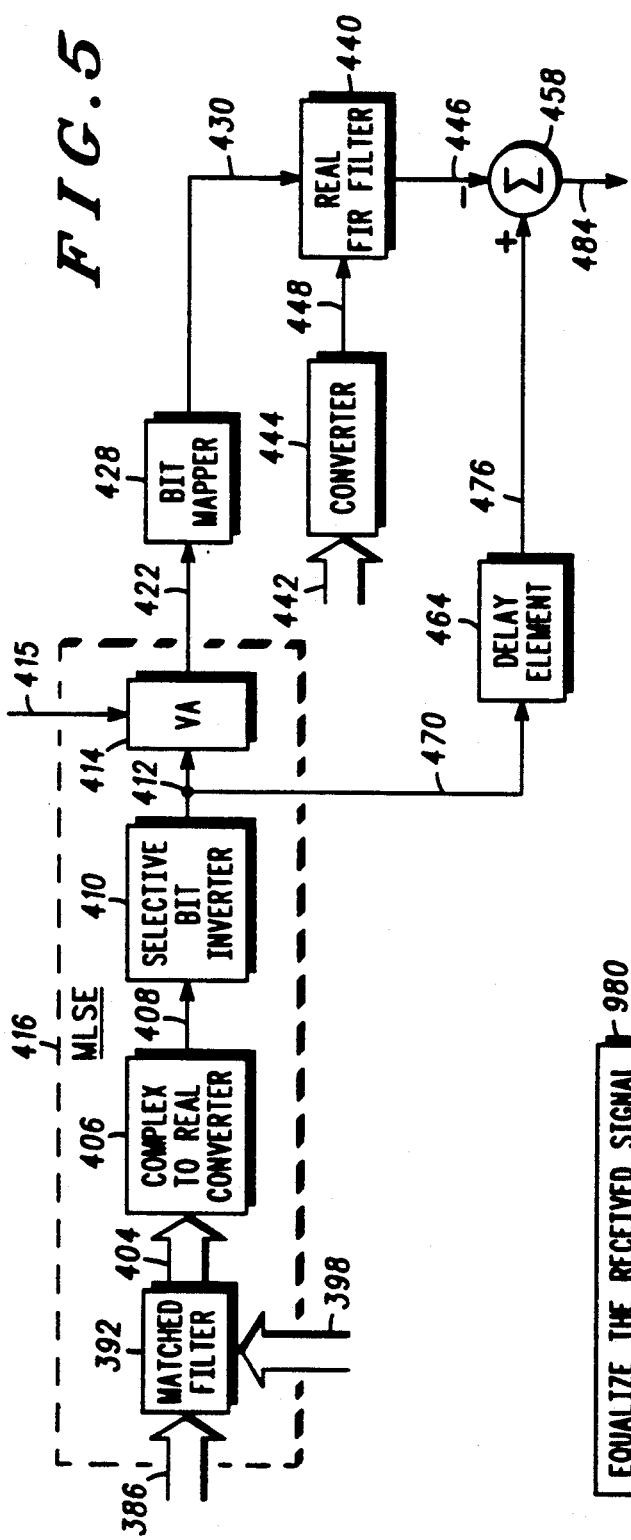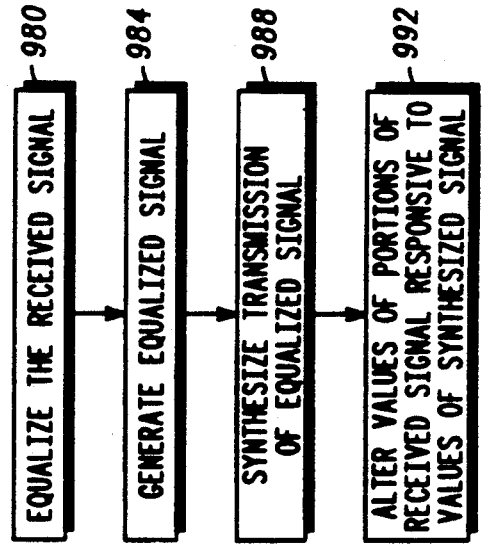

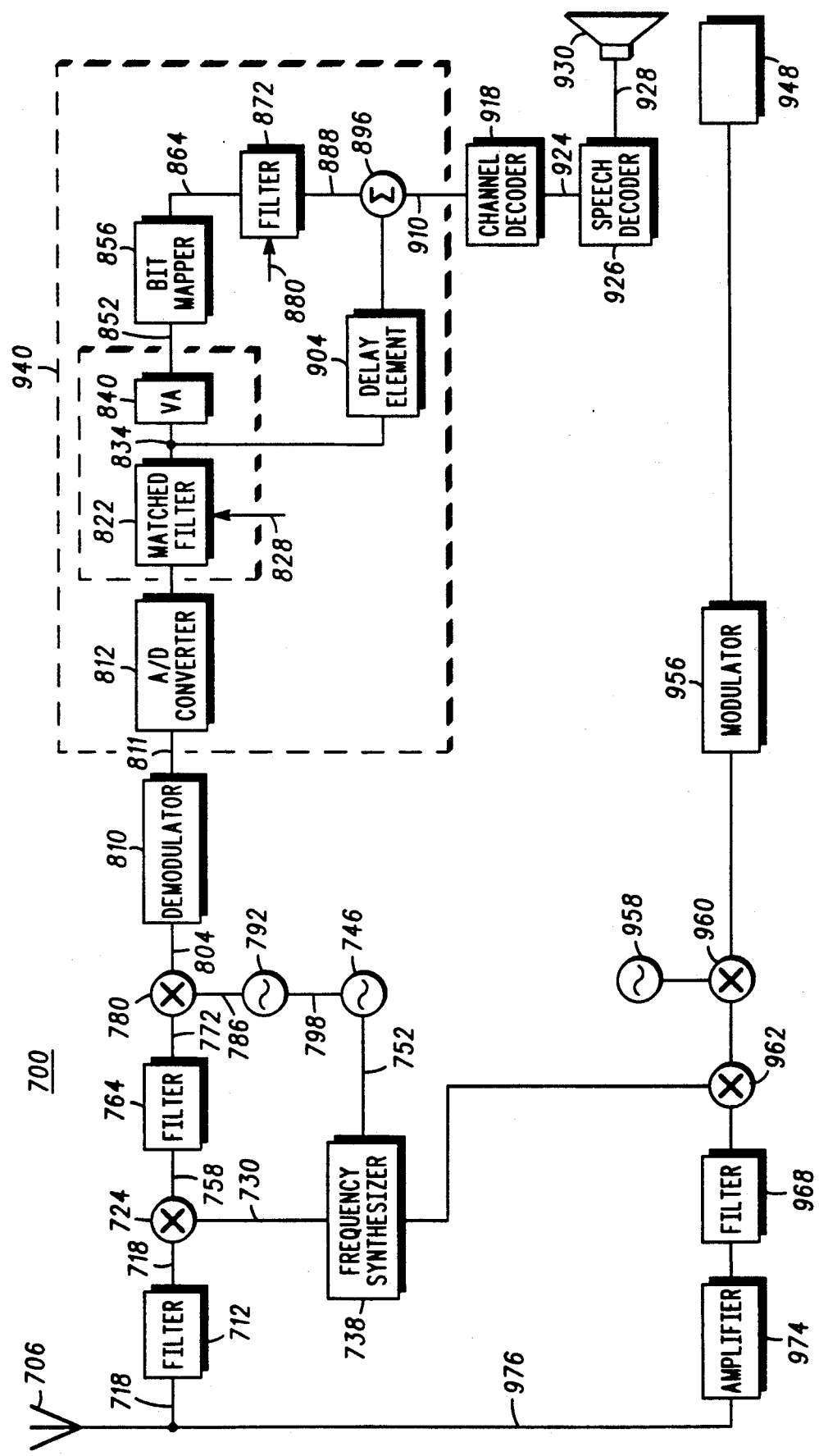

SIGNAL WEIGHTING SYSTEM FOR DIGITAL RECEIVER

BACKGROUND OF THE INVENTION

The present invention relates generally to digital receivers, and, more particularly, to a system, and associated method therefor, for weighting a signal received by the receiver to associate thereby a confidence level with the received signal.

A communication system which transmits information between two locations includes, at a minimum, a transmitter and a receiver wherein the transmitter and the receiver are interconnected by a transmission channel upon which an information signal (which contains information) may be transmitted.

In one type of communication system, a radio communication system, the transmission channel is comprised of a radio-frequency channel which interconnects the transmitter and the receiver. To transmit an information signal (referred to as a baseband signal) upon the radio-frequency channel, the information signal must be converted into a form suitable for transmission thereof upon the radio-frequency channel.

Such a conversion of the information signal into a signal suitable for transmission upon the radio-frequency channel is accomplished by a process referred to as modulation wherein the information signal is impressed upon a radio-frequency electromagnetic wave. The radio-frequency electromagnetic wave is a sinusoidal wave of a frequency of a value within a range of values of frequencies defining the radio-frequency channel. The radio-frequency electromagnetic wave is commonly referred to as a carrier signal, and the radio-frequency electromagnetic wave, once modulated by the information signal, is referred to as a modulated, information signal. The modulated, information signal comprises a communication signal which may be transmitted through free space.

The information content of the resultant, modulated, information signal occupies a range of frequencies, centered at, or close to, the frequency of the carrier signal. Because the modulated, information signal may be transmitted through free space upon the radio-frequency channel to transmit thereby the information content of the information signal between the transmitter and the receiver of the communication system, the transmitter and receiver need not be positioned in close proximity with one another.

Various modulation techniques have been developed to modulate the information signal upon the carrier signal to permit such transmission upon the radio-frequency transmission channel. Such modulation techniques include: amplitude modulation (AM), frequency modulation (FM), phase modulation (PM), frequency-shift keying modulation (FSK), phase-shift keying modulation (PSK), and continuous phase modulation (CPM). One type of continuous phase modulation is Gaussian minimum shift keying modulation (GMSK).

The receiver which receives the modulated, information signal contains circuitry to detect, or to recreate otherwise, the information signal modulated upon the carrier signal. Typically, the circuitry of the receiver includes circuitry (sometimes consisting of several stages) to convert downward in frequency the modulated, information signal received by the receiver in addition to the circuitry required to detect, or to recreate otherwise, the modulated, information signal. The process of detecting or recreating the information content of the modulated, information signal is referred to as demodulation and such circuitry for performing demodulation is referred to as demodulation circuitry or a demodulator. Sometimes, both the down-conversion circuitry and the demodulator are together referred to as demodulation circuitry.

A plurality of modulated, information signals may be simultaneously transmitted as long as the simultaneously-transmitted, modulated, information signals are comprised of carrier signals of dissimilar frequencies, and the resultant, modulated, information signals do not overlap in frequency. More particularly, the frequencies of the carrier signals of the simultaneously-transmitted, modulated, information signals must be separated in frequency to prevent the information content of the modulated, information signal (i.e., the modulation spectrum) from overlapping with corresponding signals modulated upon carrier signals of frequencies of values proximate thereto.

A receiver includes tuning and other filter circuitry to pass received signals of only certain frequencies to down-convert in frequency and to demodulate only signals within certain bandwidths. Such tuning and other filter circuitry form frequency passbands for passing only those signals having frequency components within the frequencies defined by the passbands of the tuning and other filter circuitry.

The broad range of frequencies of which the carrier signal may be comprised and upon which the information signal may be modulated is referred to as the electromagnetic frequency spectrum. Regulatory bodies have divided the electromagnetic frequency spectrum into frequency bands, each of which defines a range of frequencies of the electromagnetic frequency spectrum. The frequency bands have been further divided into channels, such channels form the transmission channels of a communication system. The regulatory bodies regulate transmission of radio-frequency signals in certain ones of the frequency bands of the electromagnetic frequency spectrum to minimize interference between simultaneously-transmitted, modulated, information signals.

For instance, portions of a 100 MHz frequency band extending between 800 MHz and 900 MHz are allocated in the United States for radiotelephone communication. Radiotelephone communication, may, for example, be effectuated by a radiotelephone utilized in a cellular, communication system. Such a radiotelephone contains circuitry to permit simultaneous generation and reception of modulated, information signals, thereby permitting two-way communication between the radiotelephone and a remotely-located receiver.

In general, a cellular, communication system is created by positioning numerous base stations at spaced-apart locations throughout a geographical area. Each base station contains circuitry to receive modulated, information signals transmitted by one, or many, radiotelephones, and to transmit modulated, information signals to the one, or many, radiotelephones. Because both a base station and a radiotelephone permits both transmission and reception of modulated, information signals, two-way communication between a radiotelephone and a base station is permitted.

The position at which each of the base stations of the cellular, communication system is located is carefully selected so that at least one base station is within the transmission range of a radiotelephone positioned at any location throughout the geographical area. Because of the spaced-apart nature of the positioning of the base stations, portions of the geographical area throughout which the base stations are located are associated with individual ones of the base stations. Portions of the geographical area positioned proximate to each of the spaced-apart base stations define "cells" wherein the plurality of cells, each associated with a base station, together form the geographical area encompassed by the cellular, communication system. A radiotelephone positioned within the boundaries of any of the cells of the cellular, communication system may transmit, and receive, modulated, information signals to, and from, at least one base station.

Typically, communication between a radiotelephone and a base station includes both data signals and voice signals which are alternately, and also simultaneously, transmitted upon one or more transmission channels. Data transmitted between the base station and the radiotelephone includes instructions to cause the radiotelephone to receive and to transmit signals upon particular radio-frequency channels. Signals are also transmitted between the base station and the radiotelephone for purposes of synchronization to ensure that transmission of the modulated, information signal from a particular base station is received by a particular radiotelephone.

Increased usage of cellular, communication systems has resulted, in many instances, in the full utilization of every available transmission channel of the frequency band allocated for cellular, radiotelephone communication. As a result, various ideas have been proposed to utilize more efficiently the frequency band allocated for radiotelephone communications. More efficient utilization of the frequency band allocated for radiotelephone communication increases the transmission capacity of a cellular, communication system.

One such means by which the transmission capacity of the cellular, communication system may be increased is to utilize digital modulation techniques. When an information signal is converted into digital form, a single transmission channel may be utilized to transmit, sequentially, more than one information signal. Because more than one information signal may be transmitted upon a single transmission channel, the transmission capacity of an existing frequency band may be increased by a multiple of two or more.

Typically, an analog information signal is first converted into digital form (such as, for example) by an analog-to-digital converter), and then encoded by some coding technique. Then, the encoded signal is modulated to transmit thereby the information signal of the radio-frequency channel. A modulation technique which may be advantageously utilized to transmit such a digital signal is the aforementioned Gaussian minimum shift keying (GMSK) modulation. Such a modulation technique is discussed more fully in a text entitled "Digital Phase Modulation" J. B. Anderson, T. Aulin, and C. E. Sundberg, Published by Plenum Press, Copyright 1986.

Transmission of any signal upon a radio-frequency transmission channel is susceptible to error as a result of noise and other interference occurring as a result of transmission of a signal upon the transmission channel. Noise is caused, for example, by the presence of spurious and other transient signals. Other interference occurs, for example, as a result of reflection of transmitted signals off of both man-made and natural objects. Such reflection of transmitted signals results in the same signal being received by a receiver at differing times (referred to as signal delay) corresponding to the path by which the signal is transmitted to the receiver. For instance, a transmitted signal which is reflected off of an object resulting in an increase in path length between the transmitter and receiver of four fifths of a mile results in a four microsecond delay as a result of the increased path length. Path lengths of increase distances result, accordingly, in delays of increased time periods. Because of such signal delay, the signal received by the receiver is actually the summation of a single transmitted signal which is transmitted to the receiver over a multiplicity of paths. The transmission channel is, therefore, oftentimes referred to as a "multipath" channel. Such signal delay results in signal interference.

When the transmitted signal is a digitally-encoded signal, such interference caused as a result of transmission of the signal upon a multipath channel results in a type of interference referred to as intersymbol interference. As the digitally-encoded signals to be utilized in a cellular, communication system are transmitted at a bit rate of in excess of 270 kilobits per second, even a delay as small as the four microsecond delay, mentioned hereinabove, can result in significant amounts of intersymbol interference.

Because the transmitted, digitally-encoded signal is encoded to increase the redundancy of the transmitted signal, some of the errors occurring as a result of such intersymbol interference (as well as errors occurring as a result of other noise) are removed during a receiver decoding process of the signal received by the receiver. However, because each error which occurs as a result of intersymbol interference which results in an incorrectly-decoded signal reduces the quality of the communication between the transmitter and the receiver, it is highly desirable to detect the existence of such errors, or to provide an indication of the likelihood of such error.

Equalizer circuitry, both of software and hardware implementations, are known, and are utilized to correct for the effects of transmission of a signal upon a multipath channel. For instance, U.S. patent application Ser. No. 422,177, filed Oct. 13, 1989, by David E. Borth, Phillip D. Rasky, and Gerrald P. Labedz, entitled "Soft Decision Decoding With Channel Equalization", and U.S. patent application Ser. No. 442,971, filed Nov. 29, 1989, by David E. Borth, entitled "Soft Trellis Decoding", both disclose systems utilizing equalizer circuitry to correct for intersymbol interference caused by transmission of a signal upon a multipath channel. The channel equalizer utilized in each of the just-mentioned disclosures is formed of a maximum likelihood sequence estimator (MLSE). An MLSE is operative to estimate sequences of a transmitted signal responsive to the signal actually received by the receiver. In general, the MLSE (as well as an equalizer of other design) is operative to remove the intersymbol interference generated as a result of transmission of a signal upon a multipath channel. The signal generated by the MLSE is then applied to the receiver decoder circuitry. The decoder circuitry decodes the equalized signal (and in the instance of an MLSE, an estimated signal) to remove redundancies in the signal intentionally created by a transmitter encoding circuitry.

Operation of an MLSE is described more fully in a paper entitled, *"Adaptive Maximum-Likelihood Receiver for Carrier-Modulated Data-Transmission Systems"*, by G. Ungerboeck, in the *IEEE Transactions on Communications*, volume COM-22, pages 624-635, May, 1974. The MLSE disclosed therein is comprised of a matched filter which is supplied with the signal received by the receiver (once down-converted and demodulated by down conversion and demodulation circuitry), and a Viterbi algorithm which is supplied with the signal passed by the matched filter.

The Viterbi algorithm forms a trellis of possible paths, a particular matrix of which is utilized to form a sequence (or stream) of data. Because the signal at the output of the Viterbi algorithm is a sequence of data bits, the output of the MLSE is a hard decision signal (i.e., comprised of a sequence of bits of digital values).

Although the transmitted signal is a digitally-encoded signal, the information signal, once modulated upon the sinusoidal, carrier signal, is an analog signal. As the possible values of which the digitally-encoded signal actually transmitted may be comprised are finite (for instance, when the digitally-encoded signal is a binary signal, the digitally-encoded signal may be of only two possible values) the output of the MLSE is of a corresponding number of possible values. The Viterbi algorithm of the MLSE converts the digitally-encoded signal applied thereto in analog form into the sequence of data. Such conversion, and resultant use of only the resultant, data sequence generated by the Viterbi algorithm does not fully utilize the entire information of the signal supplied to the MLSE.

In particular, the signal actually received by the MLSE, and passed by the matched filter forming a portion thereof, may be compared with the data sequence generated by the Viterbi algorithm of the MLSE. Such a comparison may be utilized to provide an indication of the level of confidence to be associated with the signal supplied to the receiver decoder circuitry to indicate thereby the level of confidence with which the received signal is believed to be accurate. Such an indication could be utilized to minimize further the errors resulting from intersymbol interference caused by transmission of a signal upon a multipath channel, and the resultant degradation in communication quality as a result thereof.

What is needed, therefore, is a system to utilize best the signal received by a digital receiver to minimize best the errors caused by noise and/or intersymbol interference of a signal transmitted upon a multipath channel.

SUMMARY OF THE INVENTION

The present invention, accordingly, provides a signal weighting system for associating a confidence level with a communication signal transmitted upon a multipath channel and received by a digital receiver.

The present invention further advantageously provides a receiver confidence level indicator, for a receiver constructed to receive a digitally-encoded signal, which is operative to provide a weighted, soft-decision signal for associating a confidence level with portions of a digitally-encoded signal received by the receiver.

The present invention still further advantageously provides a transceiver constructed to receive a digitally-encoded signal which incorporates a confidence level indicator operative to provide a weighted, soft-decision signal which associates a confidence level with portions of a digitally-encoded signal received by a receiver.

The present invention yet further advantageously provides a method for associating a confidence level with portions of a communication signal transmitted upon a transmission channel and received by a receiver.

In accordance with the present invention, a signal weighting system for associating a confidence level with portions of a communication signal transmitted upon a transmission channel and received by a receiver is disclosed. The system comprises an equalizer for equalizing the communication signal once received by the receiver and for generating an equalized signal indicative of the communication signal prior to transmission thereof upon the transmission channel. A synthesized transmission channel synthesizes transmission of the equalized signal generated by the equalizer, and generates a synthesized, re-transmitted signal. Values of portions of a signal representative of the communication signal transmitted upon the transmission channel and received by the receiver are altered responsive to values of corresponding portions of the synthesized re-transmitted signal generated by the synthesized transmission channel to associate thereby a confidence level with the communication channel received by the receiver.

BRIEF DESCRIPTION OF THE DRAWINGS

The present invention will be better understood when read in light of the accompanying drawings in which:

FIG. 1 is a block diagram of a communication system operable to transmit and to receive digitally-encoded information signals wherein the transmission channel comprises a multi-path channel;

FIG. 2 is a simplified, block diagram of the system of the present invention;

FIG. 3 is a functional block diagram of a finite impulse response filter which forms a portion of the system of the present invention;

FIG. 5 is a block diagram of an alternate embodiment of the system of the present invention for associating a confidence level with a communication signal comprised of a GMSK modulated signal wherein a real filter is utilized to cancel intersymbol interference of a signal transmitted upon a multipath channel;

FIG. 7 is a block diagram of a transceiver which incorporates the system of the present invention therein; and FIG. 8 is a logical flow diagram illustrating the steps of the method of the present invention.

DESCRIPTION OF THE PREFERRED EMBODIMENTS

Figure 4:
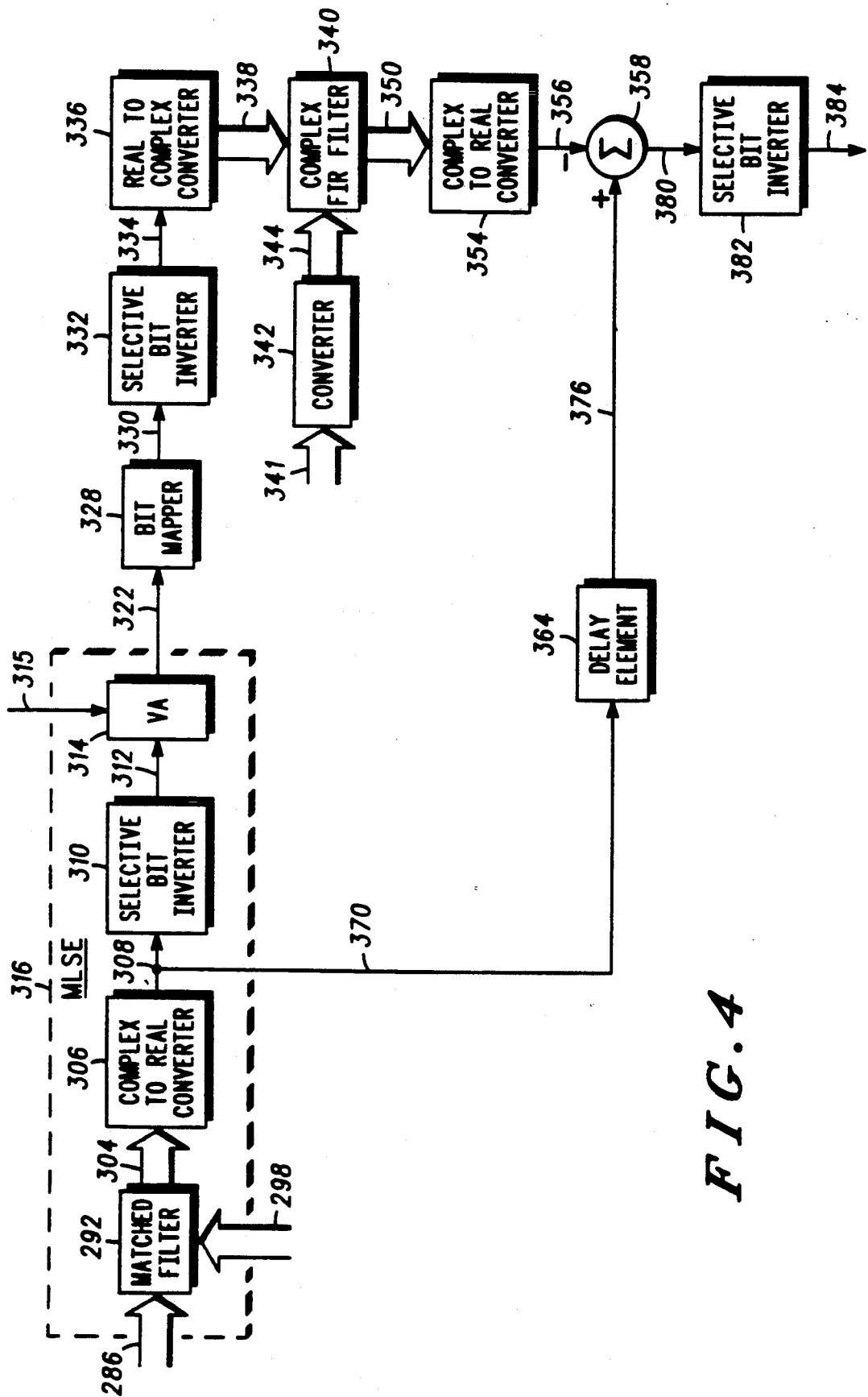
FIG. 4 is a block diagram of the system of the present invention operable to associate a confidence level with a communication signal comprised of a GMSK modulated signal.

Referring first to the block diagram of FIG. 1, a communication system, referred to generally by reference number 20, is shown. Communication system 20 is operable to transmit and to receive digitally-encoded information signals. An analog information source, here represented by block 24, is representative of the source of an information signal, such as, for example, a voice signal or a data signal. In instances in which information source 24 is comprised of a voice signal, information source 24 includes a transducer, or other suitable circuitry, for converting the voice signal into an electrical signal of desired characteristics.

The information signal generated by analog information source 24 is supplied to source encoder 28. Source encoder 28 converts the information signal supplied thereto by information source 24 into a digital signal. Source encoder 28 may, for example, be comprised of an analog-to-digital converter which generates a digital signal when supplied with an analog information signal generated by information source 24.

The digital signal generated by source encoder 28 is supplied to channel encoder 32. Alternatively, a digital information source may be directly applied to channel encoder 28. Channel encoder 32 encodes the digital signal supplied thereto according to a coding technique. Channel encoder 32 is comprised of a block and/or convolutional encoder to convert the digital signal applied thereto into an encoded form to increase the redundancy of the digital signal thereby. By increasing the redundancy of the signal, transmission errors and other signal distortions caused during transmission of a signal are less likely to result in erroneous interpretation of the information content of the actual, transmitted signal.

The encoded signal generated by channel encoder 32 is supplied to modulator 36. Modulator 36 modulates the encoded signal supplied thereto according to a modulation technique onto a radio frequency carrier. As mentioned previously, one such modulation technique by which the digital, encoded signal may be modulated includes a Gaussian minimum shift keying (GMSK) modulation technique.

Information source 24, source encoder 28, channel encoder 32, and modulator 36 together comprise the transmitter portion, referred to by block 40, shown in hatch, of communication system 20.

Modulator 36 of transmitter portion 40 generates a modulated, information signal which may be transmitted through free space upon transmission channel 44, shown in hatch, in the figure. As noted previously, a transmission channel is typically a multipath channel, and the modulated, information signal transmitted by modulator 36 is actually transmitted over a plurality of paths, here indicated by longitudinally-extending blocks 48A, 48B, . . . , 48N. Only one of the paths is the direct path, the remaining paths can cause intersymbol interference when signals are transmitted thereupon. Alternatively, there may be no direct path. The paths indicated by blocks 48A-N comprise the transmission paths of the multipath channel formed of transmission channel 44. As mentioned hereinabove, because the individual paths of the multipath channel upon which the modulated information signal is transmitted are of different path lengths, the time required to transmit the modulated, information signal over differing ones of the paths 48A-48N differ. Additionally, the multipath channel formed of transmission channel 44 is not noise-free, and noise is introduced upon the modulated, information signal as the signal is transmitted upon individual ones of the paths 48A-48N of channel 44. Such noise is indicated in the block diagram by arrow 52, and includes, for example, noise caused by thermal noise or by co-channel interference. Both the interference caused by transmission upon the multipath channel and the noise introduced during transmission thereupon reduce, if not compensated for by the receiver, the quality of the communication between the transmitter and the receiver.

The modulated, information signal transmitted upon paths 48A-48N of transmission channel 44 is received by demodulator 56. While not shown, once received, the modulated, information signal may first be applied to down-conversion circuitry to convert downwardly in frequency the received signal. Demodulator 56 demodulates the received signal, and generates a demodulated signal which is applied to channel equalizer 60. Channel equalizer 60 corrects for intersymbol interference which is introduced upon the modulated, information signal as a result of transmission thereof upon a multipath channel. Channel equalizer circuit 60 generates a signal which is supplied to channel decoder 64.

Channel decoder 64 corresponds to channel encoder 32 of transmitter portion 40, but functions to decode the encoded signal. Channel decoder 64 generates a decoded signal, in digital form, which is supplied to source decoder 68. Source decoder 68 converts the digital signal supplied thereto into a form suitable for application to information sink 72. Information sink 72 may, for example, comprise an earpiece or speaker portion of a receiver, or another such transducer, for converting the electrical signal comprising the decoded signal generated by source decoder 68 into human perceptible form. (Alternatively, for digital information, channel decoder 64 may supply the decoded signal directly to information sink 72.)

Demodulator 56, channel decoder 64, source decoder 68, and destination 72 together comprise the receiver portion, indicated by block 76, shown in hatch, of communication system 20.

Channel equalizer circuit 60 comprises the signal weighting system of the present invention wherein a confidence level is associated with the demodulated signal supplied thereto. The output signal generated by channel equalizer circuit 60 forms a soft-decision signal which, when provided to channel decoder 64, provides the decoder with an indication of the confidence level of the signal to permit more accurate decoding of the signal.

Turning now to FIG. 2, there is shown in simplified block form, the signal weighting system of the present invention. A communication signal, once transmitted upon a transmission channel, such as transmission channel 44 of FIG. 1, and received by a receiver is demodulated, and supplied, on line 86, to matched filter 92. Matched filter 92 is preferably an adaptive filter, and is matched to the multipath channel. The coefficients of matched filter 92 are supplied thereto on line 98. The coefficients supplied to filter 92 on line 98 are functions of the channel impulse response which may, for example, be determined by a channel sounding operation. It is further noted that the demodulated signal supplied to filter 92 on line 86, may be comprised of digital signals, including those digital signals comprised of large numbers of different, discrete levels to approximate thereby an analog signal. Therefore, the filtered signal generated by matched filter 92 on line 104 may similarly approximate a signal of analog form, although the information content of the signal is a digital, encoded sequence.

Line 104 is coupled to Viterbi algorithm 110 to supply the signal generated by matched filter 92 thereto. Matched filter 92 is operative to enhance the useful portion of the received signal. Viterbi algorithm 110 is supplied on line 112 with coefficients which are functions of the channel impulse response. Matched filter 92 and Viterbi algorithm 110 together form a maximum likelihood sequence estimator (MLSE) as indicated in the figure by block 116, shown in hatch. MLSE 116 is similar to the maximum likelihood sequence estimator disclosed in the aforementioned Ungerboeck reference. MLSE 116 is preferably implemented by a software algorithm embodied in the processor; alternately, of course, MLSE 116 may be of a hardware implementation. It is to be noted that, although each preferred embodiment described hereinbelow has a MLSE forming a portion thereof, the present invention may althernately include other equalizer structures, such as, for example, a near-MLSE or a decision feedback equalizer.

Viterbi algorithm 110, as is conventional, forms a trellis which estimates sequences of data when supplied with the digitally-encoded signal on line 104. The sequences of data form a hard decision signal which is generated on line 122. The sequence of data comprising the hard decision signal generated on line 122 is an estimate of a data sequence as actually transmitted (i.e., the signal as received less distortions caused by transmission over a multipath channel). However, when significant interference of the transmitted signal occurs as a result of transmission over a multipath channel, due to, e.g., noise, Rayleight fading, and/or co-channel interference the estimated sequence generated by MLSE 116 may include erroneous estimates of the transmitted signal. Because such erroneous estimates, when supplied to a receiver decoder, result in incorrect decoding of the actual, transmitted signal, quality of communication is reduced. Therefore, additional error correction is desired to minimize degradation of communication quality between a transmitter and a receiver.

Therefore, according to the present invention, rather than applying the hard decision signal generated by MLSE 116 directly to decoder circuitry, line 122 is coupled to bit mapper 128. Bit mapper 128 converts the data sequences (comprised of logical zeros and logical ones) generated on line 122 into arithmetic positive and negative values. More particularly, logical zeros are converted into positive one values (that is, $+1$), and logical ones are converted into negative one values (that is, $-1$). Similar to the implementation of MLSE 116, bit mapper 128 is preferably implemented as a software algorithm embodied in a processor; alternately, again, bit mapper 128 may be of a hardware implementation. Bit mapper 128 generates a hard decision output on line 134 which is supplied to filter 140.

Filter 140 is an adaptive filter formed of a finite impulse response (FIR) filter which, similar to matched filter 92 and Viterbi algorithm 110 receives coefficients, here on line 146, which are functions of the multipath channel impulse response which, again, are preferably determined by a channel sounding operation. Filter 140 functions to recreate the characteristics of the multipath channel, except for the direct path, upon which the communication signal was transmitted. Suitable selection of the coefficients applied on line 146 prevents recreation of the direct path of the multipath channel. It is further noted that, in the preferred embodiment of the present invention, because matched filter 92 concentrates the energy of a signal applied thereto, filter 140 is modified to not only recreate the multipath channel, but to compensate for the operation of the matched filter 92.

In essence, filter 140 synthesizes the multipath channel, except for a direct path, upon which the communication signal was transmitted. Again, similar to MLSE 116, as well as bit mapper 128, filter 140 is preferably implemented by an algorithm embodied in a processor; alternately, filter 140 may be of a hardware implementation. The signal generated by filter 140 is inverted and is supplied to summer 158.

Summer 158 is additionally supplied with the output signal generated by matched filter 92 of MLSE 116 on line 104, once suitably delayed in time by delay element 164. Delay element 164 delays the matched filter output signal generated on line 104 for a time period corresponding to the computational time period required for operation of the Viterbi algorithm 110, bit mapper 128, and filter 140 such that the signals supplied to summer 158 correspond with one another. As indicated in the figure, branch 170 of line 104 is supplied to delay element 164, and the delayed signal generated by delay element 164 is supplied to summer 158 on line 176. Again, both summer 158 and delay element 164 are preferably comprised of an algorithm embodied in a processor.

The signal supplied to summer 158 on line 176 is the filtered signal generated by matched filter 92 which is delayed in time by delay element 164. The signal supplied to summer 158 on line 152 is an estimated sequence of data, in arithmetic form, and filtered by filter 140 having filter coefficients corresponding to the characteristics of the multipath channel upon which the communication signal has been transmitted. Because filter 140 functions to synthesize portions of the multipath channel, except for the direct path, the signal generated on line 152 is representative of signals transmitted upon the portions of the multipath channel except for the direct path.

Summation of the signals supplied to summer 158 on lines 152 and 176 results in the alteration of values of the filtered, delayed signal (supplied to summer 158 on line 176) by the value of the signal supplied to summer 158 on line 152. Because the signal generated on line 176 includes values representative of the signal generated upon the direct path, the output signal generated by summer 158 on line 184 includes only values representative of the signal generated upon the direct path. Signals representative of signals transmitted upon the other paths of the multipath channel are subtracted out by summer 158. A confidence level is associated with the values of the digitally-encoded signals corresponding with the magnitude of the signal generated on line 184. Application of such a signal to a channel decoder, represented in the figure by block 190, permits more accurate decoding of the signal, thereby reducing the decoding error and increasing the quality of the resultant communication signal. Decoder 190 is, preferably, a soft-decision, Viterbi decoder when a convolutional coder is employed as the channel encoder 32 in FIG. 1.

FIG. 3 is a block diagram of a three-tap, finite impulse response (FIR) filter similar in design with that of filter 140 of FIG. 2. Although in the preferred embodiment, filter 140 is comprised of a nine-tap filter, operation of the three-tap filter illustrated in FIG. 3 is similar to that of a nine-tap filter.

The three-tap FIR filter of FIG. 3, referred to generally by reference number 240, is supplied with an input signal on line 234. The signal on line 234 is supplied, in sequence, to delay elements 248 and 254. The signal on line 234 is also coupled to coefficient block 260 to supply the signal on line 234 thereto; the output side of delay element 248 is coupled to coefficient block 264 to supply the delayed signal generated by delay element 248 thereto; and the output side of delay element 254 is coupled to coefficient block 268 to supply the delayed signal generated by delay element 254 thereto. Coefficient blocks 260-268 are additionally supplied with input signals on lines 272, 276, and 280, respectively, of values corresponding to the coefficients which are functions of the channel impulse response. Output sides of coefficient blocks 260, 264, and 268 are further supplied to summer 282. Summer 282 sums the signal supplied thereto and generates an output signal on line 284. As will be noted with respect to the preferred embodiments of the present invention described hereinbelow, the center tap of the filter, here the output signal generated by coefficient block 264, is of a value of zero, as the input signal supplied thereto is of a value of zero.

When the signal supplied to filter 240 on line 234 is comprised of a hard decision signal formed of a sequence of bit values, application of such a sequence to delay elements 248-254 cause the signals at the output sides of the respective blocks to be of values corresponding to adjacent bits of the sequence of data supplied thereto on line 234. A nine-tap FIR filter is similar to filter 240 of FIG. 3, but is comprised of eight delay elements rather than the two delay elements (i.e., elements 248-254), as illustrated. The number of coefficient blocks, correspondingly, also increases. With reference to the three-tap FIR filter as illustrated, the input signal and the signals at the output sides of each of the delay elements, which are of values corresponding to three successive bits of the data streams supplied thereto, are weighted by respective coefficient blocks 260, 264, and 268. When the coefficients of blocks 260, 264 and/or 268 are of values of zero, no resultant signal is supplied to summer 282 from that coefficient block. A coefficient of zero is indicative of the absence of intersymbol interference upon that path. When, however, intersymbol interference occurs as a result of transmission upon a multipath channel, the values of the coefficient blocks 260-268 are of values other than zero. For instance, if the output signal of delay element 248 is considered to be "the current data bit" the signal supplied on line 234 is, therefore, indicative of the value of a "succeeding data bit", and the signal at the output side of delay element 254 is indicative of the value of the "preceding data bit". The summed signal generated on line 284 is therefore the summation of the weighted values of the current data bit and the values of the succeeding and preceding data bits to synthesize thereby the effects of transmission of a signal on a multipath channel. A nine-tap FIR filter, similarly, synthesizes transmission of a signal upon a multipath channel, but forms a signal indicative of interference caused by a greater number of data bits.

FIG. 4 is a block diagram of the signal weighting system of the present invention which associates the confidence level proportions of a communication signal when the communication signal is modulated by a differentially-encoded, GMSK modulation technique. Details of the differential encoding of the signal are described in more detail in a document entitled "GSM Recommendation 05.04: Modulation". A signal modulated by a differentially-encoded, GMSK modulation technique may be mathematically represented by the following equation:

$$x(t) = \sum_{k=1}^{\infty} (-1)^k a_{2k-1} p(t - 2kT) \cos(\omega_c t) - \sum_{k=1}^{\infty} (-1)^k a_{2k-2} p(t - 2kT + T) \sin(\omega_c t)$$

where
- $a_k$ are nondifferentially-encoded data bits with values of $+/-1$;
- $\omega_c$ is the carrier frequency in radians/second;
- T is the bit period; and
- p(t) is an equivalent baseband pulse which may be approximately expressed by: $p(t) = \cos(\pi t/2T)$ when $-T < = t < = T$, and zero elsewhere.

By using a complex notatio, x(t) may be represented by:

$$x(t) = Re\left[\sum_{k=1}^{\infty} j^{k-1} a_k p(t - (k-1)T) e^{j\omega_c t}\right] = Re[X(t)]$$

where X(t) is the complex form (analytic form) of the real signal x(t) and Re [ ] is an operator which generates the real part of the complex number within the brackets ([ ]).

When such a GMSK-modulated signal is received by a GMSK receiver, demodulation circuitry (and, in particular, a quadrature demodulator) of the receiver is operative to remove the cosine and sine terms of the first above-listed equation, or, equivalently, to remove the $e^{j\omega_c t}$ term in the second above-listed equation such that, by multiplying a factor of $e^{-j\omega_c t}$ to the complex form of x(t) of the second above-listed equation and then taking the real portion. That is, $$Re[e^{-j\omega_c t} X(t)] = Re\left[\sum_{k=1}^{\infty} j^{k-1} a_k p(t - (k+1)T) e^{j\omega_c t} e^{-j\omega_c t}\right]$$

$$= Re\left[\sum_{k=1}^{\infty} j^{k-1} a_k p(t - (k+1)T)\right]$$

or, equivalently, $$Re[e^{-j\omega_c t} X(t)] = \sum_{k=1}^{\infty} (-1)^k a_{2k-1} p(t - 2kT) + \sum_{k=1}^{\infty} (-1)^k a_{2k-2} p(t - 2kT + T).$$

Because of the $(-1)^k$ term, every other pair of bits of the demodulated signal are inverted. Such inversion of alternate bit-pairs occurs as a result of differential encoding combined with the GMSK modulation process.

Practically, the demodulation is performed on the received signal that is obtained after the GMSK signal propagates through a multipath channel with additive noise. After being demodulated, the complex received signal can be expressed as:

$$r(t) = \sum_{k=1}^{\infty} j^{k-1} a_k h(t - (k+1)T) + w(t)$$

where
- $h(t) = g(t) * p(t)$ is the response of the entire transmission channel including the multipath channel and transmitter and receiver filters, and where g(t) is the complex low-pass equivalent impulse response of the multipath channel (and where * denotes convolution);

w(t) is complex additive white Gaussian noise; and r(t) is the complex representation of the received signal.

With reference to FIG. 4, a demodulated signal generated by a quadrature demodulator is supplied on line 286 to matched filter 292. The use of the bold-type arrow in FIG. 4 is indicative a complex signal generated thereon. As shown above, a received GMSK signal may be represented using such a complex notation. Matched filter 292 is an adaptive filter, and the coefficients thereof are functions of the channel impulse response which are supplied to matched filter 292 on line 298. The impulse response of the matched filter may be defined by the equation:

$$g_{mf}(t) = h^*(-t)$$

where the superscript * refers to a complex conjugate operation and h(t) is the total channel response defined above.

Matched filter 292 generates a filtered, complex signal on line 304 which is sampled every time T and which may be expressed mathematically by the equation:

$$z_n = r(t) * g_{mf}(t) \big|_{t=IT} = \sum_l j^{n-l} a_{n-l} S_l + u_n$$

where $S_l = [h(t) * h^*(-t)] \big|_{t=lT}$; and $u_n$ is the noise after matched filtering and sampling.

The resulting complex sample $z_n$, generated on line 304 is supplied to complex to real converter 306 which converts the complex signal samples supplied thereto into real form. A real signal formed by converter 306 is generated on line 308 which is coupled to selective bit inverter 310. Inverter 310 converts alternate bit-pairs, which are supplied to Viterbi algorithm 314. Alternate bit-pairs of the signal supplied to inverter 310 are inverted because of the differential encoding of the signal prior to transmission thereof. It should be noted that the combined effects of complex-to-real converter 306 and selective sample inverter 310 are equivalent to multiplying the complex sample $z_n$ by $j^{-n-1}$, and then taking the real part, i.e., $z_n' = \text{Re}[j^{-n-1} z_n]$ of the resultant product.

The Viterbi algorithm 314, similar to the Viterbi algorithm 110 of FIG. 2, forms a trellis which estimates sequences of data responsive to the signals supplied thereto, and is supplied with coefficients which are functions of the channel impulse response on line 315. The real valued, received signal that is supplied to Viterbi algorithm 314 may be written as:

$$z_n' = \sum_l a_{n-l} S_l + u_n'$$

where the real valued coefficients $s_l$ are governed by the equation:

$$s_l = \text{Re}[j^{-l} S_l] = \text{Re}[j^{-l} [h(t) * h^*(-t)]] \big|_{t=lT} = s_{-l}$$

The Viterbi algorithm determines as the most likely sequence, the sequence $\{a_n\} = \{a'_n\}$ which maximizes the survivor metric $J_n(\sigma_n)$ from states $\{\sigma_{n-1}\}$ to state $\sigma_n$ via the equation:

$$J_n(\sigma_n) = a_n' z_n' + \max_{\{\sigma_{n-1}\} \to \{\sigma_n\}} \{J_{n-1}(\sigma_{n-1}) - F(\sigma_{n-1}, \sigma_n)\}$$

where:

$\sigma_n$ is a current state of the Viterbi algorithm;

$a'_n$ is an estimated data bit;

J is a survivor metric; and

F is a possible successor state transition metric given by:

$$a_n' \sum_l a_{n-l} s_l$$

and the maximization is over all state transitions from possible states $\sigma_{n-1}$ to $\sigma_n$ Matched filter 292, complex to real converter 306, selective bit converter 310, and Viterbi algorithm 314 together comprise maximum likelihood sequence estimator (MLSE) 316. Similar to MLSE 116 of FIG. 2, MLSE 316 is preferably comprised of an algorithm embodied in a processor; alternately, MLSE 316 may be of a hardware implementation.

Viterbi algorithm 316 generates a data sequence on line 322 which is supplied to bit mapper 328. Bit mapper 328 maps the values of the binary, data sequence to arithmetic values (i.e., binary zeros are mapped to positive one values, and binary ones are mapped to negative one values). Bit mapper 328 generates an arithmetic data sequence on line 330 which is supplied to selective bit inverter 332. Selective bit inverter 332 functions in a manner similar to, but in reverse of, selective bit inverter 310 of MLSE 316. Bit inverter 332 functions to reintroduce the $(-1)^k$ term of the above mathematical expression.

Bit inverter 332 generates a signal on line 334 which is supplied to real to complex converter 336. Converter 336 functions in a manner similar to, but in reverse of, complex to real converter 306 of MLSE 316, and converts the real signal supplied thereto into complex form on line 338.

The complex signal generated on line 338 is supplied to filter 340 which, similar to filter 140 of FIG. 2, comprises a nine-tap finite impulse response (FIR) filter, but because the filter synthesizes transmission of a GMSK signal, filter 340 is a complex filter. Namely, because the signal supplied to filter 340 is a complex signal, filter 340 is a complex FIR filter. Filter 340 is an adaptive filter having coefficients supplied thereto by (preferably) a channel sounding operation which are preferably governed by the same equation, defined hereinabove, which defines the coefficients supplied to Viterbi algorithm 314 on line 315. The coefficients are supplied on line 341, are converted into complex form by complex converter 342, and supplied to filter 340 on line 344.

Filter 340 functions in a manner similar with that of filter 140 of FIG. 2 to synthesize a multipath channel, and, hence, to synthesize transmission of the complex signal supplied thereto on line 338. (Similarly, the characteristics of filter 340 are modified to compensate for the operation of matched filter 292.) The center tap of filter 340 has a coefficient of zero so that the direct path of the transmitted signal is not synthesized. Filter 340 generates an output signal on line 350 which is supplied to complex to real converter 354. Complex to real converter converts the complex signal supplied thereto on line 315 into real form in a manner similar to converter 306 of MLSE 316.

Converter 354 generates a signal on line 356 which is inverted and supplied to summer 358. Summer 358 is additionally supplied with the signal generated on line 308 by converter 306, suitably delayed in time by delay element 364. As indicated in the figure, the signal generated by converter 306 is supplied to delay element 364 on line 370, and the delayed signal generated by delay element 364 is supplied to summer 358 on line 376. Delay element 364 delays the signal supplied thereto for a time period corresponding to the time period required of Viterbi algorithm 314 and succeeding operations required to synthesize transmission of the data sequence generated therefrom upon the multipath channel formed by filter 340.

Similar to summer 158 of the simplified diagram of FIG. 2, summer 358 generates a resultant difference signal on line 380. Line 380 is coupled to bit inverter 382 which is operative to remove the bit inversions of alternate data bit-pairs which are reintroduced by bit inverter 332 prior to synthesis of modulation of the signal. A non-inverted signal is generated by bit inverter 382 on line 384 which may be supplied to a receiver decoder (i.e., a channel decoder similar to channel decoder 190 of FIG. 2) which performs decoding operations.

Turning now to the block diagram of FIG. 5, an alternative embodiment of the signal weighting system of the present invention for associating a confidence level with a GMSK-modulated signal transmitted by a multipath channel is shown. The block diagram of FIG. 5 is an implementation of the system of the present invention which utilizes a real FIR filter (rather than complex FIR filter utilized in the embodiment of FIG. 4).

Similar to the block diagram of FIG. 4, a complex signal generated by a quadrature demodulator is supplied on line 386 to matched filter 392. Matched filter 392 is an adaptive filter and additionally receives coefficients which are functions of the channel impulse response on line 398. Matched filter 392 generates a filtered signal on line 404 which is supplied to complex to real converter 406. Complex to real converter 406 converts the complex signal supplied thereto on line 404 into real form on line 408. Line 408 is coupled to bit inverter 410. Bit inverter 410 inverts alternate bit-pairs of the signal supplied thereto in a manner similar to bit inverter 310 of FIG. 4. A non-inverted signal is generated by bit inverter 410 on line 412 which is supplied to Viterbi algorithm 414. Viterbi algorithm 414 is supplied with coefficients on line 415 which are functions of the channel impulse response, and which may be governed by the same equation utilized to define the coefficients of the channel impulse response supplied to Viterbi algorithm 314 of FIG. 4 on line 315.

Matched filter 392, complex to real converter 406, bit inverter 410, and Viterbi algorithm 414 together comprise a maximum likelihood sequence estimator (MLSE) 416.

Viterbi algorithm 414 forms a trellis to generate an estimated bit stream on line 422. Line 422 is coupled to bit mapper 428. Bit mapper 428 functions in a manner similar to bit mapper 328 of FIG. 4, and generates an arithmetic signal on line 430 which is supplied directly to filter 440. Filter 440 is an adaptive nine-tap, real finite impulse response (FIR) filter. Filter 440 is supplied with real coefficients which are functions of the channel impulse response. The coefficients are supplied on line 442, are converted by converter 444 to be in real form, and are supplied to filter 440 on line 448.

Filter 440 is operative in a manner similar to operation of filter 340 of FIG. 4 and filter 140 of FIG. 2 to synthesize a multipath channel. (Filter 440 is again modified to compensate for the operation of the matched filter, here matched filter 392.) Again, the center tap of the filter is of a coefficient of zero. When the arithmetic signal generated on line 430 is supplied to filter 440, transmission of the signal over a multipath channel is synthesized. Filter 440 generates an output signal on line 446, an inverse of which is supplied to summer 458.

More particularly, the signal supplied to filter 440 on line 430 is a sequence $\{a'_k\}$ where $a'_k$ are the arithmetic representations of data bits estimated by the MLSE estimator described above that take the value of $+/-1$. As a result, the output of FIR filter 440 on line 446 may be represented by the equation:

$$v_n = \sum_{k=-4}^{4} f_k a_{n-k}$$

where $f_k$ is the k-th real FIR coefficient generated by the converter 444 from the complex coefficients $s_k$, and where: $f_k = Re[j^{-k}S_k]$ when k is not equal to zero, and zero when k is equal to zero. It may be determined from the above equation that $f_k$ for $k = -4, \ldots, 0, \ldots, 4$, etc. may be explicitly expressed by:

$$S_{r_4}, -Si_3, -S_{r_2}, Si_1, 0, Si_1, -S_{r_2}, -Si_3, S_{r_4}$$

where $S_{r_k}$ and $Si_k$ denote the real and imaginary portions of $S_k$, respectively.

It may also be determined that the signal generated on line 470 is the same as the signal generated on line 310 of FIG. 4 and can be represented by:

$$z_n' = Re[j^{-n-1}z_n] = Re\left[\sum_l j^{-n-1}j^{n-l-1}a_{n-l}S_l + j^{-n-1}u_n\right] =$$

$$Re \sum_l a_{n-l}Re[j^{-l}S_l] + u_n'$$

where $u_n'$ is the additive real noise.

Assuming the decisions from the MLSE are correct, i.e., $a'_n$ is equal to the transmitted bit $a_n$, from the above equations it may be determined that the output of the summer 458 is equal to $a_n s_0 + u_n'$. It is known from the theory of MLSE estimation, the magnitude of this value is indicative of the reliability of the decision $a_n$. This conclusion also approximately holds for times when the MLSE makes occasional, erroneous decisions. Thus the output of summer 458 may be used as the soft decision information for the receiver decoder.

Summer 458 additionally is supplied with the non-inverted signal generated by bit inverter 410 on line 412 which is suitably delayed by delay element 464. The non-inverted signal generated by bit inverter 412 is supplied to delay element 464 on line 470, and delay element 464 generates a non-inverted, delayed signal on line 476 which is coupled to summer 458. Delay element 464 delays the signal supplied thereto for a time period corresponding to the time period required of the Viterbi algorithm 414 and for synthesis of transmission of the signal generated on line 430. Summer 458 generates a difference signal on line 484 which is supplied to a receiver decoder to decode the signal thereat. The receiver decoder comprises soft decision Viterbi decoder.

Figure 6:
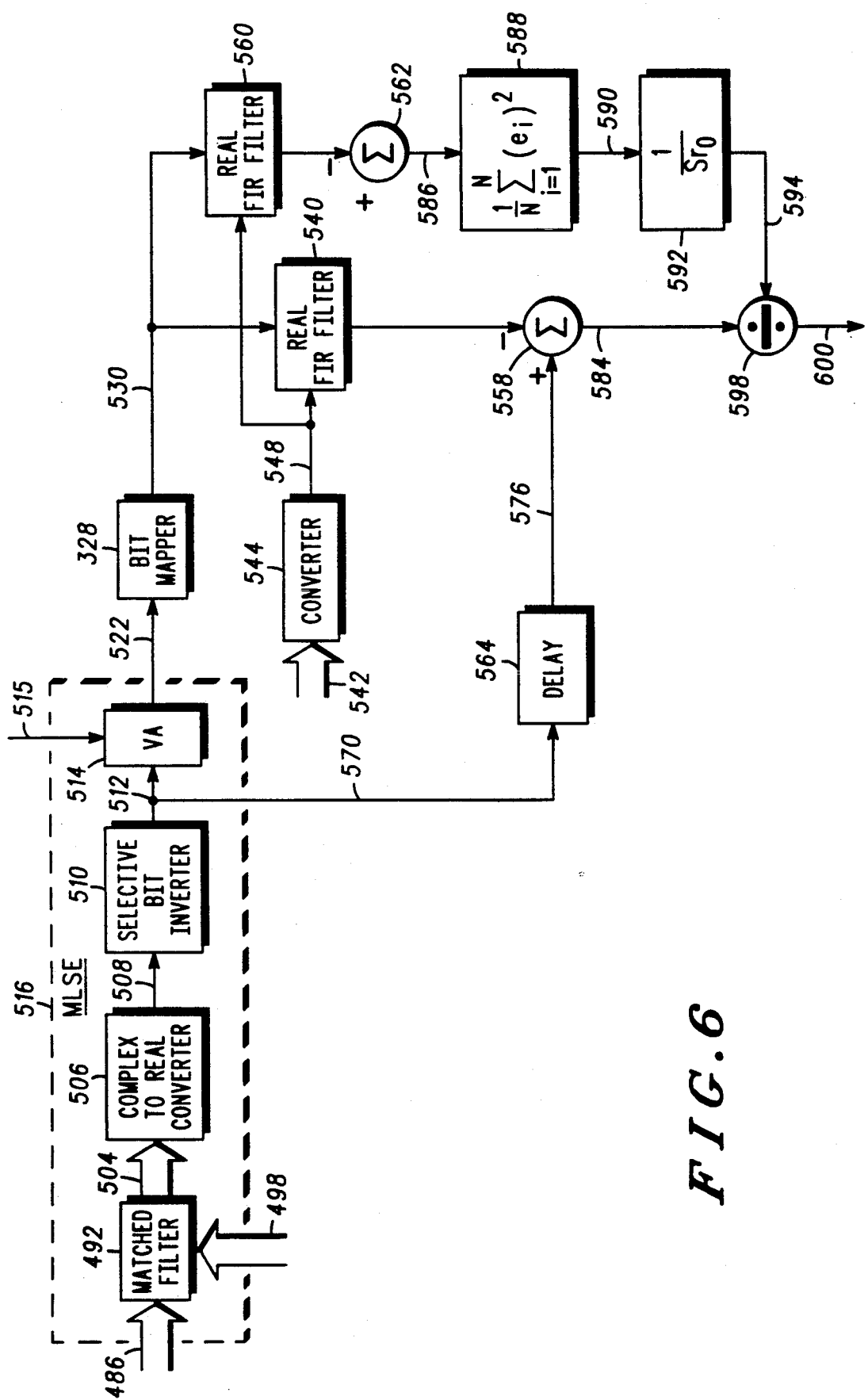
FIG. 6 is a block diagram of a further embodiment of the system of the present invention for associating a confidence level with portions of a communication signal transmitted upon a multipath transmission channel in which interference is additionally caused by the presence of time-varying noise, such as that caused by co-channel interference.

FIG. 6 is a block diagram of a signal weighting system of the present invention further including means for weighting the signal to associate the confidence level with portions of a signal, such as a GMSK-modulated signal, additionally according to the noise present on a multipath channel. Similar to the block diagram of FIG. 5 a complex signal generated by a quadrature demodulator is supplied on line 486 to matched filter 492. Matched filter 492 is an adaptive filter and is supplied with coefficients which are functions of a channel impulse response on line 498. Matched filter 492 generates a signal on line 504 which is supplied to complex to real converter 506. Converter 506 generates a real signal on line 508 which is supplied to selective bit inverter 510. Bit inverter is operative in a manner similar to bit inverter 410 of FIG. 5, and generates a non-inverted output signal on line 512 which is supplied to Viterbi algorithm 514. Viterbi algorithm 514 is supplied with coefficients which are functions of the channel impulse response on line 515. Matched filter 492, converter 506, inverter 510 and Viterbi algorithm 514 may together form a maximum likelihood sequence estimator (MLSE) indicated by block 516, shown in hatch.

The Viterbi algorithm 514 forms a trellis operative to estimate sequences of data responsive to application of the signal thereto on line 512. The estimated sequences are generated on line 522 and are supplied to bit mapper 528. Bit mapper 528 is operative to convert the binary-value data stream supplied thereto into arithmetic values (i.e., positive and negative one values). The arithmetic data stream formed by bit mapper 528 is generated on line 530 and is supplied to filter 540 which is, similar to filter 440 of FIG. 5, comprised of a nine-tap real FIR filter. Filter 540 is supplied with real coefficients which are functions of the channel impulse response. The coefficients are supplied on line 542, are converted by converter 554 to be in real form, and are supplied to filter 540 on line 548. Again, the coefficient of the center tap of filter 540 is of a value of zero. (The characteristics of filter 540 are modified to compensate for the effects of matched filter 492.)

The arithmetic data stream generated on line 530 is additionally supplied to filter 560 which is also a nine-tap real FIR filter having coefficients which are a function of the channel impulse response. Filter 560 synthesizes a channel in which all multipath signal components are present (including, this time, that corresponding to the direct path), and application of the data stream thereto permits synthesis of transmission of the signal on a transmission channel. The inverse of the signal formed by filter 560 is supplied to summer 562.

Summers 558 and 562 additionally are supplied with the non-inverted signal generated by bit inverter 510 which is suitably delayed in time by delay element 564. Line 570 interconnects bit inverter 510 and delay element 564, and delay element 564 generates a delayed, non-negative signal on line 576 which is supplied to summers 558 and 562. The output of summer 562 is an error signal, $e_i$, and is supplied on line 586 to block 588 which computes a sample variance of the signal supplied thereto on line 586. The sample variance is calculated according to the equation illustrated within block 588. The calculated sample variance is supplied on line 590 to block 592, whereat, as illustrated, the sample variance is further scaled by the factor $1/Sr_0$. $Sr_0$ is the zero-lag, autocorrelation of the matched filter coefficients; additionally $Sr_0$ is the inner product of the complex vector of matched filter coefficients with itself. The scaled, sample variance calculated at block 592 is supplied on line 594 to divider 598. Divider 598 divides values of the signal generated on line 584 by the signal generated on line 594, and generates a signal on line 600 which may be supplied to a receiver decoder for decoding of the signal thereat.

FIG. 7 illustrates a transceiver, referred to generally to reference numeral 700, which utilizes the signal weighting system of the present invention as a portion thereof. Transceiver 700 may, for example, comprise a radiotelephone utilized in a cellular, communication system. It is noted that the receiver portion of transceiver portion 700 is also functionally similar to a receiver-only unit, such as a pager. It is therefore noted that the signal weighting system of the present invention may also be utilized as a portion of a receiver, such as a pager.

A signal transmitted upon a multipath channel is received by antenna 706. As noted previously, the multipath channel may be a noisy channel, and intersymbol interference may also be formed as a result of transmission of the signal upon the multipath channel.

The signal received by antenna 706 is supplied to filter 712 on line 718. Filter 712 filters the received signal and generates a filtered signal on line 718. Line 718 is coupled to mixer 724 which also receives an oscillating signal on line 730 formed by frequency synthesizer 738 responsive to the oscillating frequency of reference oscillator 746, the oscillating signal generated thereat being connected to synthesizer 738 on line 752. Mixer 724 converts downward in frequency the signal supplied thereto on line 718, and generates a down-converted signal on line 758 which is supplied to filter 764. Filter 764 generates a filtered signal on line 772 which is supplied to second mixer 780.

Mixer 780 additionally receives an oscillating signal input on line 786 supplied by oscillator 792. The oscillating frequency of oscillator 792 is controlled by the oscillating frequency of reference oscillator 746 and is coupled to oscillator 746 on line 798. Mixer 780 generates a second, down-converted signal on line 804 which is supplied to demodulator circuit 810.

Demodulator circuit 810 may, for example, comprise of a quadrature demodulator when the signal transmitted to transceiver 700 is comprised of a GMSK-modulated signal. Demodulator 810 generates a demodulated signal on line 811 which is supplied to A/D converter 812 and then to matched filter 822.

Matched filter 822 is an adaptive filter, as described previously, and is supplied with coefficients which are functions of the channel impulse response on line 828. Matched filter 822 generates a signal on line 834 which is supplied to the Viterbi algorithm 840. Matched filter 822 and Viterbi algorithm 840 together comprise a MLSE, indicated by block 848 in the figure, shown in hatch.

Viterbi algorithm 840 generates a hard decision signal on line 852 which is supplied to bit mapper 856. Bit mapper 856 converts the logical values of the binary data sequence supplied thereto into arithmetic form and generates an arithmetic data stream on line 864 which is supplied to adaptive filter 872. Adaptive filter 872 is, as mentioned previously, a nine-tap FIR filter which synthesizes portions of the multipath channel (i.e., the FIR filter synthesizes the multipath channel except for the direct path thereof), and is supplied with coefficients which are a function of the channel impulse response on line 880.

Filter 872 generates a signal on line 888 which is supplied to summer 896. Summer 896 additionally is supplied with signal generated by filter 822 on line 834 suitably delayed in time by delay element 904. Summer 896 generates a difference signal on line 910 which is supplied to the channel decoder 918 which, typically, comprises a soft-decision convolutional decoder. Decoder 918 decodes the soft-decision signal supplied thereto and generates a decoded signal on line 924 which is supplied to speech decoder 926. Speech decoder 926 generates a signal on line 928 which is supplied to a transducer such as speaker 930, to convert the decoded signal into human perceptible form. Circuit elements indicated by reference numerals 822-896 are enclosed by block 940, shown in hatch, and are similar to the block diagram of the signal weighting system of FIG. 2. The signal weighting systems of FIGS. 4, 5 or 6, may similarly be utilized to form a circuit within block 940.

The block diagram of FIG. 7 further illustrates a transmit portion of transceiver 700 comprising speech-/source/channel encoder 948 (which may additionally comprise a transducer such as a microphone), modulator 956, offset oscillator 958, mixer 960, mixer 962, filter 968, and amplifier 974. An amplified signal generated by amplifier 974 is applied to antenna 706 on line 976 to permit transmission therefrom.

Turning now to the logical flow diagram of FIG. 8, the method steps of the method of present invention for associating a confidence level of with portions of a communication signal transmitted upon the transmission channel and received by a receiver are shown. First, and as indicated by block 980, the communication signal, once received by the receiver is equalized. Next, and as indicated by block 984, an equalized signal indicative of the communication signal prior to transmission thereof upon the transmission channel is generated. Next, and as indicated by block 988, transmission of the equalized signal is synthesized (except for the direct path thereof) and a synthesized re-transmitted signal is generated thereby. Finally, and as indicated by block 992, values of portions of the communication signal transmitted upon the transmission channel and received by the receiver are altered responsive to values corresponding to portions of the synthesized signal to associate thereby a confidence level with the communication channel received by the receiver.

While the present invention has been described in connection with the preferred embodiment shown in the various figures, it is to be understood that other similar embodiments may be used and modifications and additions may be made to the described embodiments for performing the same function of the present invention without deviating therefrom. For example, while the preferred embodiment employs a binary, sixteen-state MLSE channel equalizer with a nine-tap FIR filter for multipath signal reconstruction, in general, for M-ary modulation transmitted over a multipath channel having a delay interval of up to L symbol periods, the resulting embodiment would employ an M-ary, $M^L$ state MLSE equalizer with a 2L+1 tap FIR filter for multipath signal reconstruction. In addition, this invention is not limited to multipath mobile radio channels; it may be applied to other channels encountering intersymbol interference including microwave radio links, satellite channels, wireline channels, etc. Therefore, the present invention should not be limited to any single embodiment, but rather construed in breadth and scope in accordance with the recitation of the appended claims.

What is claimed is:

1. A signal weighting system for associating a confidence level with portions of a communication signal transmitted upon a transmission channel and received by a receiver, said system comprising:
   means forming an equalizer for equalizing the communication signal once received by the receiver and for generating an equalized signal indicative of the communication signal prior to transmission thereof upon the transmission channel;
   means forming a synthesized transmission channel for synthesizing transmission of portions of the equalized signal generated by said means for equalizing and for generating a synthesized signal representative of signals transmitted upon certain paths of the transmission channel thereby; and
   means for altering values of portions of a signal representative of the communication signal transmitted upon the transmission channel and received by the receiver responsive to values of corresponding portions of the synthesized signal generated by said means for synthesizing transmission to associate thereby a confidence level with the communication signal received by the receiver.

2. The signal weighting system of claim 1 wherein the equalizer formed by the means for equalizing comprises a maximum likelihood sequence estimator.

3. The signal weighting system of claim 2 wherein said maximum likelihood sequence estimator is comprised of a matched filter and a Viterbi algorithm.

4. The signal weighting system of claim 3 wherein the matched filter comprises an adaptive filter.

5. The signal weighting system of claim 1 wherein said means for equalizing further comprises means forming a complex to real converter for converting the communication signal into real form when the communication signal is comprised of a complex communication signal.

6. The signal weighting system of claim 1 wherein the equalized signal generated by the equalizer comprises a hard decision signal.

7. The signal weighting system of claim 1 wherein said means for synthesizing transmission of the equalized signal comprises at least one adaptive filter.

8. The signal weighting system of claim 7 wherein said adaptive filter comprises a finite impulse response filter.

9. The signal weighting system of claim 7 wherein said means for synthesizing transmission comprises a first adaptive filter which generates a first synthesized signal having values of levels indicative of levels of intersymbol interference formed on the synthesized transmission channel, and a second adaptive filter which generates a second synthesized signal having values of levels indicative of levels of time-varying noise formed on the synthesized transmission channel.

10. The signal weighting system of claim 9 wherein said means for altering alters values of the portions of the communication signal responsive to values of corresponding portions of both the first synthesized signal generated by the first adaptive filter and the second synthesized signal generated by the second adaptive filter.

11. The signal weighting system of claim 1 wherein said means for synthesizing transmission further comprises means for synthesizing a complex modulated signal.

12. The signal weighting system of claim 11 wherein said means for synthesizing synthesizes a Gaussian minimum shift keying modulated signal.

13. The signal weighting system of claim 1 wherein said means for altering comprises means for summing portions of the signal representative of the communication signal transmitted upon the transmission channel and received by the receiver and inverses of the corresponding portions of the synthesized signal generated by the means for synthesizing transmission.

14. The signal weighting system of claim 13 wherein said means for summing generates a soft decision, output signal wherein alteration of the values of portions of the signal representative of the signal transmitted upon the transmission channel and received by the receiver indicate the confidence level associated with the communication signal received by the receiver.

15. A receiver confidence level indicator for a receiver constructed to receive a digitally-encoded signal, said receiver confidence level indicator operative to provide a weighted, soft-decision signal for associating a confidence level with portions of the digitally-encoded signal received by the receiver, said receiver confidence level indicator comprising:
 means forming as equalizer for equalizing the digitally-encoded signal once received by the receiver and for generating an equalized signal indicative of the digitally-encoded signal prior to transmission thereof;
 means forming a synthesized transmission channel for synthesizing transmission of portions of the equalized signal generated by said means for equalizing and for generating a synthesized signal thereby; and
 means for altering values of portions of a signal representative of the digitally-encoded signal received by the receiver responsive to values of corresponding portions of the synthesized signal to weight thereby the digitally-encoded signal and form the soft-decision signal therefrom.

16. A transceiver constructed to receive a digitally-encoded signal modulated and transmitted by a transmitter upon a multipath transmission channel, said transceiver comprising:
 means forming for antenna for converting the digitally-encoded signal transmitted upon the multipath transmission channel into an electrical signal representative of the digitally-encoded signal;
 means forming frequency conversion circuitry for down-converting the frequency of the electrical signal formed by the antenna to form a down-converted signal thereby;
 means forming an equalizer for equalizing the down-converted signal once received by the receiver and for generating an equalized signal indicative of the digitally-encoded signal prior to modulation and transmission thereof by the transmitter;
 means forming a synthesized transmission channel for synthesizing transmission of portions of the equalized signal generated by said means for equalizing, and for generating a synthesized signal representative of signals transmitted upon certain paths of the multipath transmission channel thereby; and
 means for altering values of portions of the digitally-encoded signal received by the receiver responsive to values of corresponding portions of the synthesized signal to associate thereby a confidence level with the digitally-encoded signal received by the receiver.

17. The transceiver of claim 16 wherein said means for down-converting further comprises means for demodulating the digitally-encoded signal.

18. The transceiver of claim 17 wherein said means for demodulating comprises a quadrature demodulator.

19. The method of claim 17 wherein said step of altering comprises summing portions of the communication signal transmitted upon the transmission channel and received by the receiver and inverses of corresponding portions of the synthesized signal.

20. A method for associating a confidence level with portions of a communication signal transmitted upon a transmission channel and received by a receiver, said method comprising the steps of:
 equalizing the communication signal once received by the receiver;
 generating an equalized signal indicative of the communication signal prior to transmission thereof upon the transmission channel;
 synthesizing transmission of portions of the equalized signal and generating a synthesized signal thereby;
 altering values of portions of a signal representative of the communication signal transmitted upon the transmission channel and received by the receiver responsive to values of corresponding portions of the synthesized signal to associate thereby a confidence level with the communication signal received by the receiver.

* * * * *